United States Patent
Hsieh et al.

(10) Patent No.: US 10,083,911 B2
(45) Date of Patent: Sep. 25, 2018

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Hao-Chih Hsieh, Kaohsiung (TW); Tun-Ching Pi, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 15/428,069

(22) Filed: Feb. 8, 2017

(65) Prior Publication Data
US 2018/0226348 A1     Aug. 9, 2018

(51) Int. Cl.
| | |
|---|---|
| H01L 23/31 | (2006.01) |
| H01L 23/538 | (2006.01) |
| H01L 25/065 | (2006.01) |
| H01L 25/00 | (2006.01) |
| H01L 21/56 | (2006.01) |

(52) U.S. Cl.
CPC ........ *H01L 23/5387* (2013.01); *H01L 21/561* (2013.01); *H01L 23/3121* (2013.01); *H01L 23/3142* (2013.01); *H01L 23/5386* (2013.01); *H01L 25/0655* (2013.01); *H01L 25/50* (2013.01)

(58) Field of Classification Search
CPC ............... H01L 21/561; H01L 23/3121; H01L 23/3142; H01L 23/5386; H01L 23/5387; H01L 25/0655; H01L 25/50
See application file for complete search history.

(56) References Cited

U.S. PATENT DOCUMENTS

| | | | | |
|---|---|---|---|---|
| 5,796,164 | A * | 8/1998 | McGraw | H01L 23/24 257/679 |
| 5,907,477 | A | 5/1999 | Tuttle et al. | |
| 6,027,958 | A * | 2/2000 | Vu | H01L 21/568 257/679 |
| 7,659,604 | B2 | 2/2010 | Fujiwara et al. | |
| 9,455,230 | B1 * | 9/2016 | Park | H01L 23/49827 |
| 2006/0071349 | A1 * | 4/2006 | Tokushige | H01L 23/5387 257/784 |
| 2006/0258050 | A1 * | 11/2006 | Fujiwara | H01L 23/29 438/112 |

FOREIGN PATENT DOCUMENTS

CN          203932048 U       11/2014

* cited by examiner

*Primary Examiner* — Allan R Wilson
(74) *Attorney, Agent, or Firm* — Foley & Lardner LLP; Cliff Z. Liu

(57) ABSTRACT

A semiconductor device package includes a flexible substrate, an electronic component, at least one flexible member, and a package body. The electronic component is disposed on the flexible substrate. The at least one flexible member is disposed on the flexible substrate. The package body encapsulates the electronic component and has a first part and a second part separated from the first part by the at least one flexible member.

24 Claims, 17 Drawing Sheets

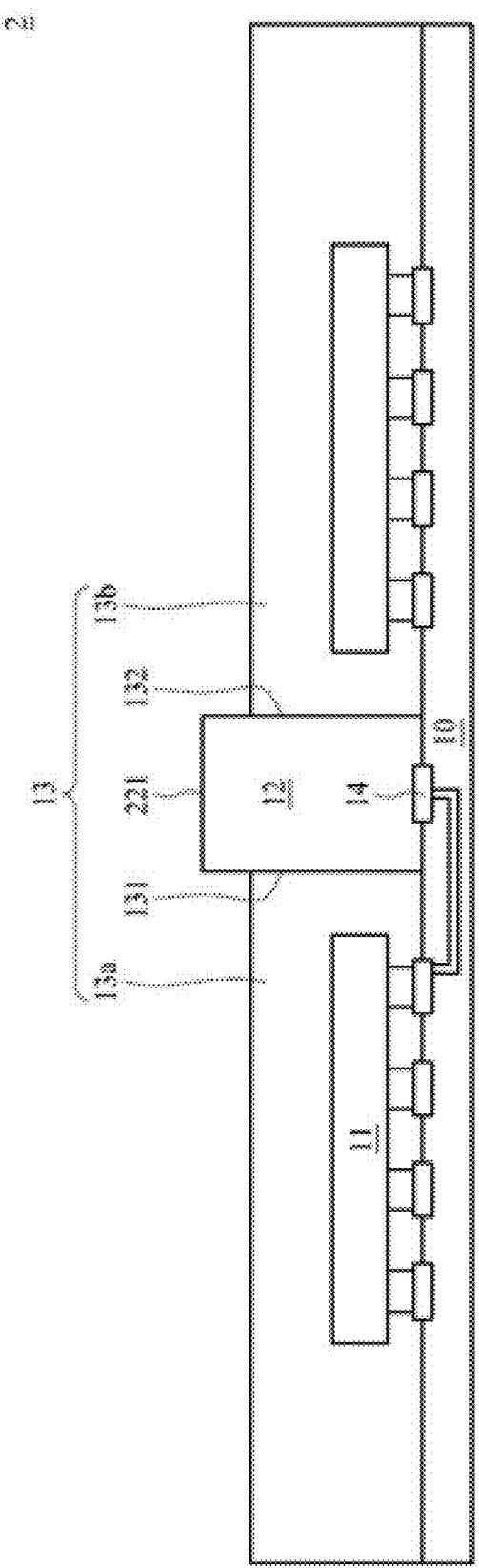

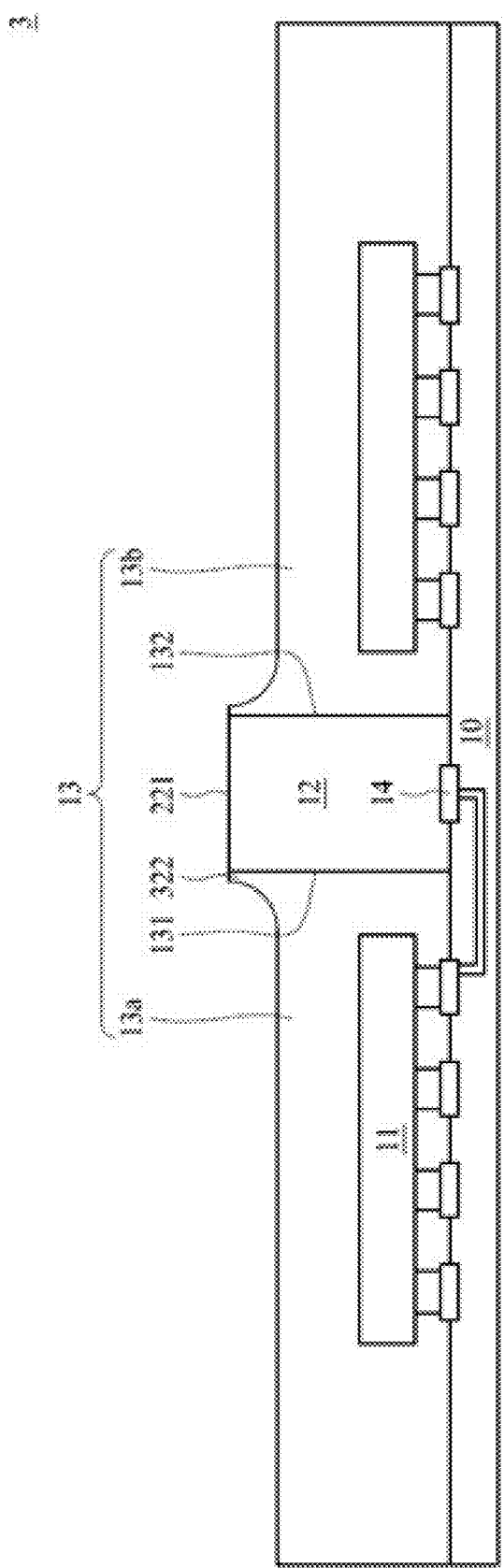

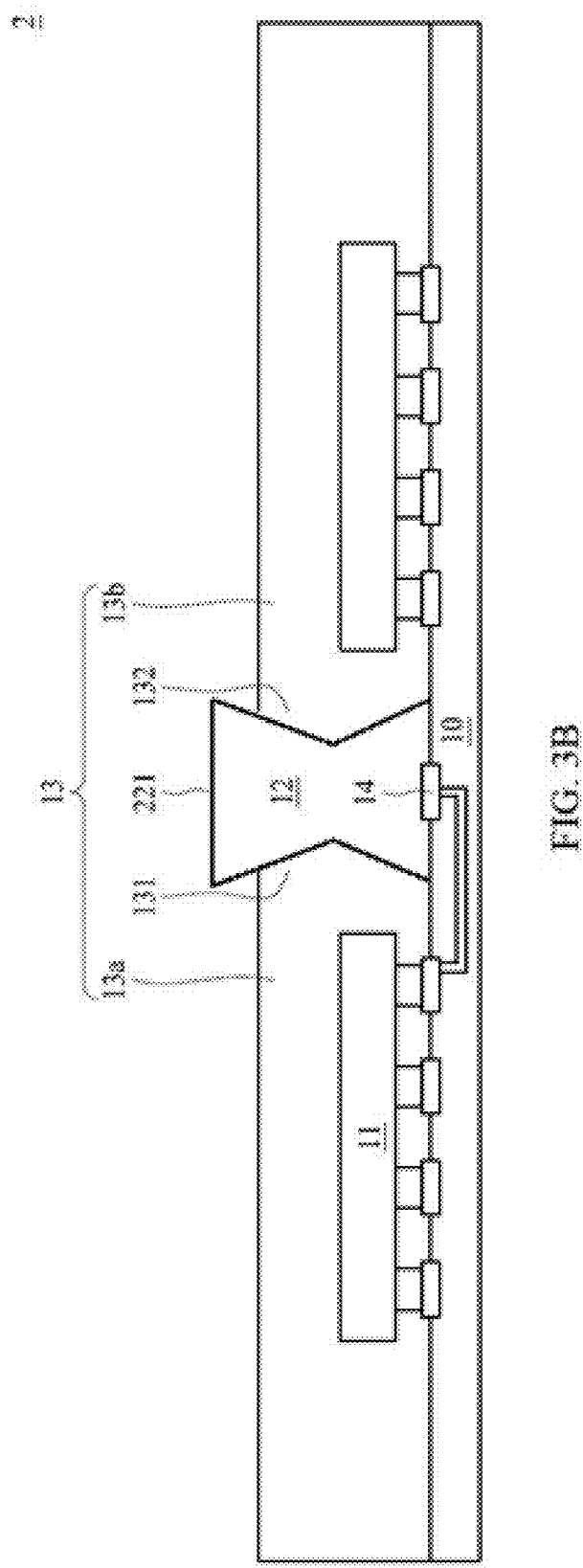

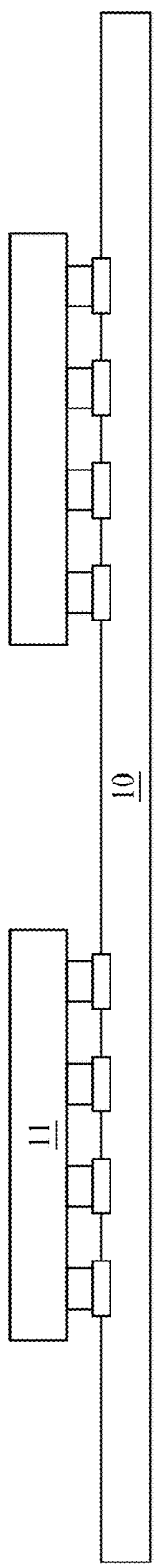

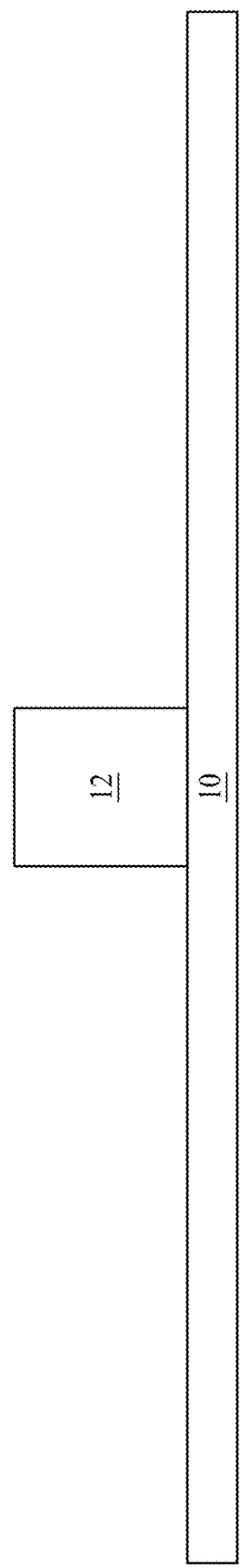

| Cell | 1 | 2 | 3 | 4 | 5 | 6 | 7 |
|---|---|---|---|---|---|---|---|
| Flexible Material — Shape | 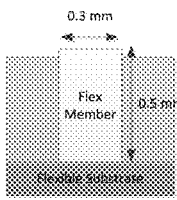 | 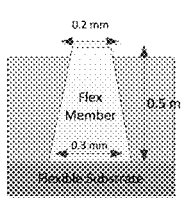 | 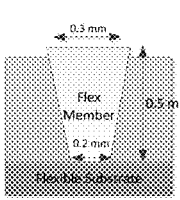 | 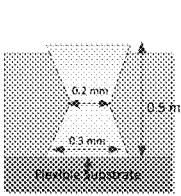 | 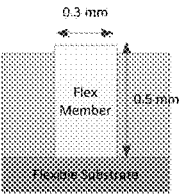 | | |
| Flexible Material — Pitch (mm) | 5 | 5 | 5 | 5 | 10 | 20 | 30 |
| Deflection (mm) | 21.7 | 20.3 | 21.0 | 20.6 | 18.0 | 16.2 | 15.4 |
FIG. 8

SEMICONDUCTOR DEVICE PACKAGE AND METHOD OF MANUFACTURING THE SAME

BACKGROUND

1. Technical Field

The present disclosure relates to a semiconductor device package and a method of manufacturing the same, and more particularly to a semiconductor device package including flexible members and a method of manufacturing the same.

2. Description of the Related Art

A flexible printed circuit board (FPCB) may be used as a substrate in packaging a semiconductor device to form a semiconductor device package (e.g. for wearable electronic device). A package body, which can be relatively hard or rigid compared to some other components of the semiconductor device package, may be used to encapsulate the rest of the semiconductor device and the substrate for protection. However, an inflexible package body inflexible package body may limit general flexibility of the semiconductor device package. Moreover, overbending of the semiconductor device package may damage the FPCB.

SUMMARY

In some embodiments, according to one aspect, a semiconductor device package includes a flexible substrate, an electronic component, at least one flexible member, and a package body. The electronic component is disposed on the flexible substrate. The at least one flexible member is disposed on the flexible substrate. The package body encapsulates the electronic component and has a first part and a second part separated from the first part by the at least one flexible member.

In some embodiments, according to another aspect, a semiconductor device package includes a flexible substrate, an electronic component, a first flexible member and a second flexible member, and a package body. The electronic component is disposed on the flexible substrate. The first flexible member and the second flexible member are disposed on the flexible substrate. The package body encapsulates the electronic component and at least a portion of the package body is disposed between the first flexible member and the second flexible member.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

FIG. 2A is a cross-sectional view of a semiconductor device package in accordance with some embodiments of the present disclosure.

FIG. 3A is a cross-sectional view of a semiconductor device package in accordance with some embodiments of the present disclosure.

FIG. 3B is a cross-sectional view of a semiconductor device package in accordance with some embodiments of the present disclosure.

FIG. 6A, FIG. 6B, FIG. 6C, and FIG. 6D illustrate a method of manufacturing a semiconductor device package in accordance with some embodiments of the present disclosure.

FIG. 7A, FIG. 7B, FIG. 7C, and FIG. 7D illustrate a method of manufacturing a semiconductor device package in accordance with some embodiments of the present disclosure.

FIG. 8 sets forth Table 2, which lists an example simulation result for some embodiments of the present disclosure.

DETAILED DESCRIPTION

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that in practice, implementations of the structures described herein can be spatially arranged in any orientation or manner, provided that the merits of embodiments of this disclosure are not deviated by such arrangement.

Figure 1A:
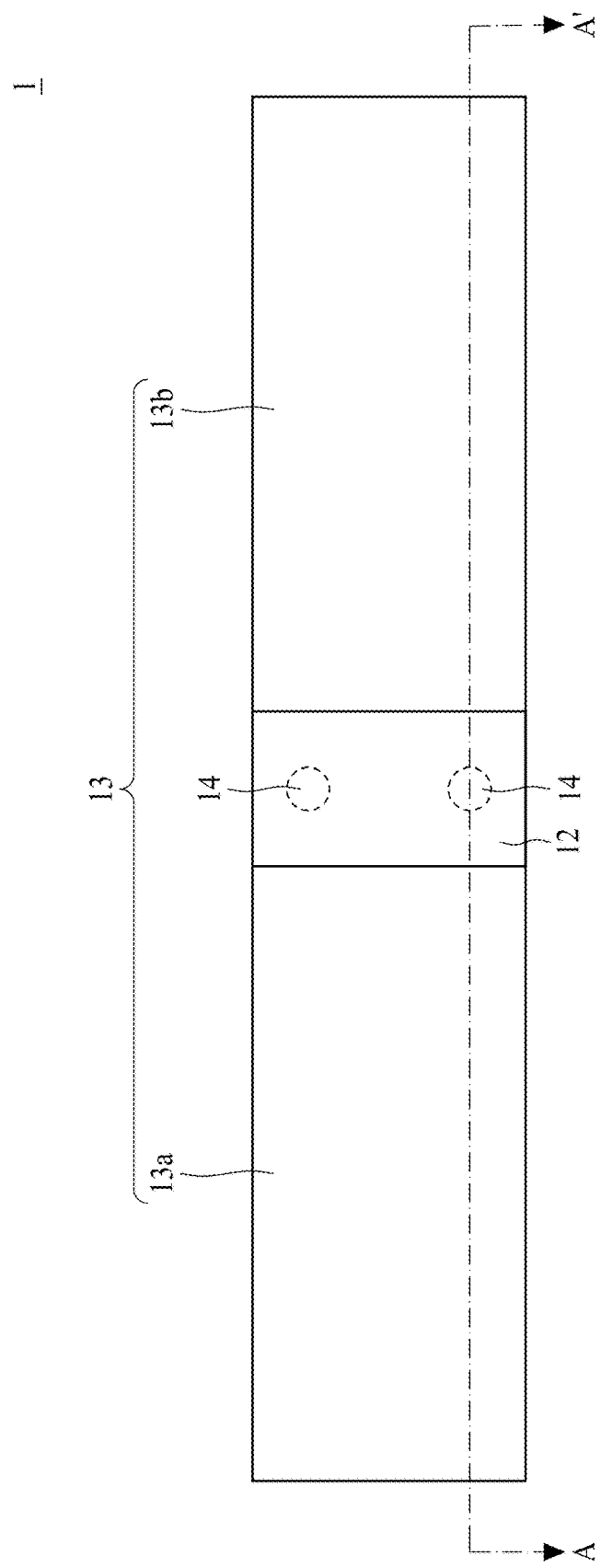
FIG. 1A is a top view of a semiconductor device package in accordance with some embodiments of the present disclosure.

FIG. 1A is a top view of a semiconductor device package in accordance with some embodiments of the present disclosure. The semiconductor device package 1 includes a flexible member 12, conductive contacts 14 and a package body 13. The conductive contacts 14 are covered by the flexible member 12. The package body 13 includes a first part 13a and a second part 13b. The flexible member 12 separates the first part 13a from the second part 13b.

Figure 1B:
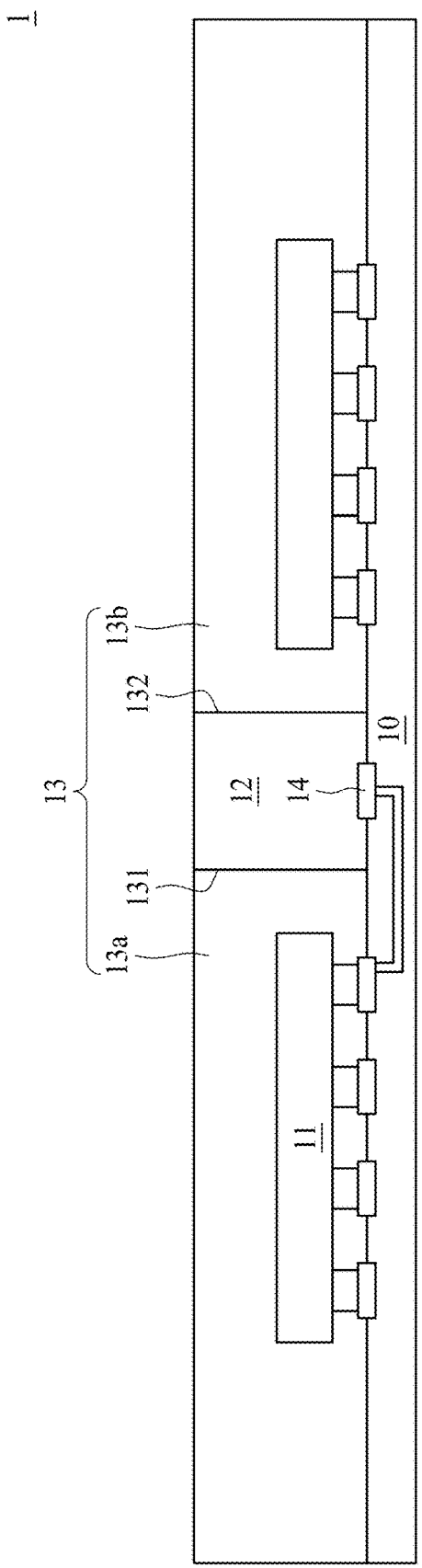
FIG. 1B is a cross-sectional view of a semiconductor device package in accordance with some embodiments of the present disclosure.

FIG. 1B is a cross-sectional view across line AA' of the semiconductor device package 1 as shown in FIG. 1A. The semiconductor device package 1 includes a flexible substrate 10, an electronic component 11, at least one flexible member 12, and a package body 13.

The flexible substrate 10 includes a suitable flexible material. For example, the flexible substrate 10 may include a flexible printed circuit board (FPCB).

The electronic component 11 is disposed on the flexible substrate 10. The electronic component 11 may include an active electronic component and/or a passive electronic component.

The at least one flexible member 12 is disposed on the flexible substrate 10. The at least one flexible member 12 may include suitable flexible material. The flexible material may be, for example, of a film type or a liquid type. When film-type flexible material is used, the at least one flexible member 12 may be formed by thermal curing or ultraviolet (UV) curing the film-type flexible material, for example.

When liquid-type flexible material is used, the at least one flexible member 12 may be formed by UV curing the liquid-type flexible material, for example. One advantage of using liquid-type flexible material is that no thermal process is necessary, so the cost and time of the package manufacturing process can be reduced. In some embodiments, the flexible material may include a silicone adhesive or another polymeric or elastomeric material.

The package body 13 encapsulates the electronic component 11. The package body 13 has a first part 13a and a second part 13b that is separated from the first part 13a by the at least one flexible member 12. Inserting the at least one flexible member 12 in the package body 13 can make the semiconductor device package 1 exhibit relatively greater flexibility than would otherwise be the case. Implementation of the at least one flexible member 12 along with the flexible substrate 10 can also help to protect the semiconductor device package 1 from excessive bending.

The first part 13a of the package body 13 has a first surface 131 facing the at least one flexible member 12 and the second part 13b of the package body 13 has a second surface 132 facing the at least one flexible member 12. The at least one flexible member 12 contacts the first surface 131 and the second surface 132. In some embodiments, a top surface of the package body 13 is substantially coplanar with a top surface of the at least one flexible member 12.

The conductive contact 14 is disposed on the flexible substrate 10. The conductive contact 14 may include a trace or a pad disposed on the flexible substrate 10. The conductive contact 14 is covered by the flexible member 12. The conductive contact 14 is electrically connected to the electronic component 11.

Although not illustrated in FIG. 1B, in some embodiments the conductive contact 14 is exposed. The conductive contact 14 can be exposed by removing the flexible member 12 from the flexible substrate 10. The exposed conductive contact 14 may be used for electrical testing.

The semiconductor device package 1 may include a wire-bond type die (not shown in FIG. 1B), and the connection wires may be vulnerable to damage by, for example, mold flow during a molding operation or an encapsulation operation. Moreover, the electronic components (e.g. electronic component 11) or other devices may be damaged by mold chase during a molding operation or an encapsulation operation. Further, delamination resulting from coefficient of thermal expansion (CTE) mismatch between a molding compound (e.g. the package body 13) and the flexible substrate 10 may cause the electronic components to disconnect from the conductive pads (e.g. may break the electrical connection between an electronic component and a conductive pad, or cause the electrical connection to be deficient) on the flexible substrate 10, potentially creating an open circuit.

The exposed conductive contact 14 may be used as a test point/terminal to check whether the circuitry of the semiconductor device package 1 works prior to assembling the semiconductor device package 1 to a system board (e.g. a printed circuit board (PCB)). Problems or defects caused during a molding operation or an encapsulation operation as described above can be found by testing the semiconductor device package 1 through the exposed conductive contact 14 prior to assembling the semiconductor device package 1 to the system board. In other words, semiconductor device packages with one or more defects may be removed from an assembly line or production process. Therefore, some cost of manufacturing is saved. Flexible material, which can be the same or similar to a material of the at least one flexible member 12, may be disposed on the exposed conductive contact 14 for protection.

The flexible member 12 can be removable. After assembling the semiconductor device package 1 to the system board, the at least one flexible member 12 can be removed to expose the conductive contact 14 for electrical testing. After assembling the semiconductor device package 1 to the system board, the at least one flexible member 12 can be removed to expose the conductive contact 14 to check whether there is any short or open circuit between the semiconductor device package 1 and the system board.

Table 1 lists some simulation conditions for simulations (such as those described below in reference to Table 2) involving some simulated embodiments of the present disclosure. The package characteristics listed in Table 1 are representative of some embodiments described herein. The package size of the semiconductor device package may be about 200× about 20 millimeters squared ($mm^2$). The thickness of the package body (e.g. an encapsulant) may be about 0.45 mm. The thickness of the flexible substrate may be about 0.275 mm. The external force applied to the semiconductor device package may be 1 Newton (N).

TABLE 1

| Package conditions | |
|---|---|
| Package size | 200 × 20 $mm^2$ |
| Encapsulant thickness | 0.45 mm |
| Substrate thickness | 0.275 mm |
| Simulation for processing model | |
| External force | 1N |

FIG. 2 is a cross-sectional view of a semiconductor device package 2 in accordance with some embodiments of the present disclosure. The semiconductor device package 2 is similar to the semiconductor device package 1 as described and illustrated above with reference to FIG. 1, except that a top surface 221 of the at least one flexible member 12 is higher than a top surface of the package body 13 (e.g. protrudes from the package body 13). By setting the top surface 221 of the at least one flexible member 12 higher than the top surface of the package body 13, the stress between the package body 13 and the at least one flexible member 12 can be reduced when the semiconductor device package 2 is bent, and deflection of the semiconductor device package 2 (e.g. displacement of one or more particular points on components of the semiconductor package 2 under stress) can be well controlled.

In some embodiments, the top surface 221 of the at least one flexible member 12 is coplanar with the top surface of the package body 13.

Figure 2B:
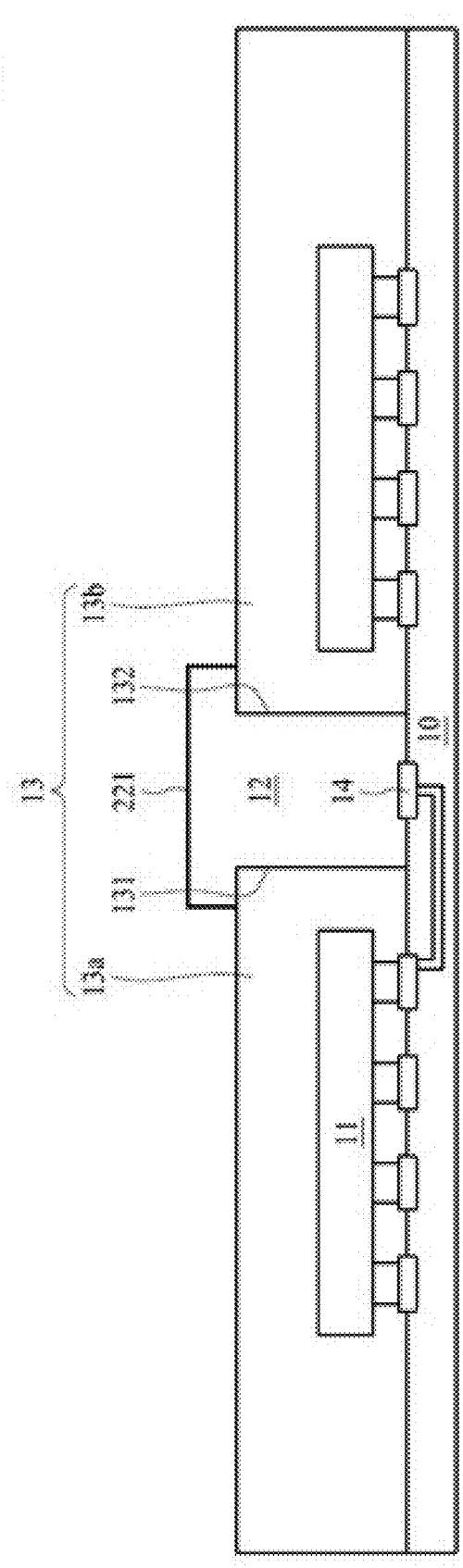
FIG. 2B is a cross-sectional view of a semiconductor device package in accordance with some embodiments of the present disclosure.

In some embodiments, the at least one flexible member 12 extends away from the flexible substrate 10 (e.g. extends vertically, as shown in FIG. 2) and is disposed over the package body 13 such that a first part (e.g. a top portion) of the at least one flexible member 12 is disposed over the package body 13 (see FIG. 2B). In other words, a top portion of the at least one flexible member 12 may extend laterally and cover at least a portion of the package body 13.

FIG. 3 is a cross-sectional view of a semiconductor device package 3 in accordance with some embodiments of the present disclosure. The semiconductor device package 3 is similar to the semiconductor device package 2 as described and illustrated above with reference to FIG. 2, except that a lateral surface of a first part (e.g. a top portion) of the at least one flexible member 12 contacts an extension portion 322 of the package body 13. The extension portion 322 of the package body 13 can protrude to at least some extent from a rest of the package body 13, and can have a substantially curved-ramp or arc shape which ramps up to the top surface 221 of the at least one flexible member 12. Such a configuration can absorb more stress between the package body 13 and the at least one flexible member 12 when the semiconductor device package 3 is bent.

In some embodiments, the at least one flexible member 12 includes a first portion and a second portion. The width of the first portion can be different from the width of the second portion. In some embodiments, the at least one flexible member 12 has tapered sidewalls. In some embodiments, the first portion and the second portion may be tapered differently. For example, proceeding along one direction (e.g. an upward direction away from the flexible substrate 10), the first portion may taper inwards (e.g. may become narrower), and proceeding in the same direction the second portion may taper outwardly (e.g. may become wider), resulting in a substantially hourglass shape for the at least one flexible member 12.

In some embodiments, the at least one flexible member 12 includes a first portion, a second portion and a third portion. The second portion is disposed between the first portion and the third portion. The width of the second portion is the same as or smaller than at least one of the width of the first portion and the width of the third portion. In some embodiments, the at least one flexible member 12 has a substantially hourglass shape (see FIG. 3B).

In some embodiments, the modulus of elasticity of the at least one flexible member is less than the modulus of elasticity of the package body. In some embodiments, the modulus of elasticity of the at least one flexible member 12 is in a range of about 0.4 Megapascal (MPa) to about 70 MPa. In some embodiments, the modulus of elasticity of the package body 13 is about 22000 MPa.

Figure 4:
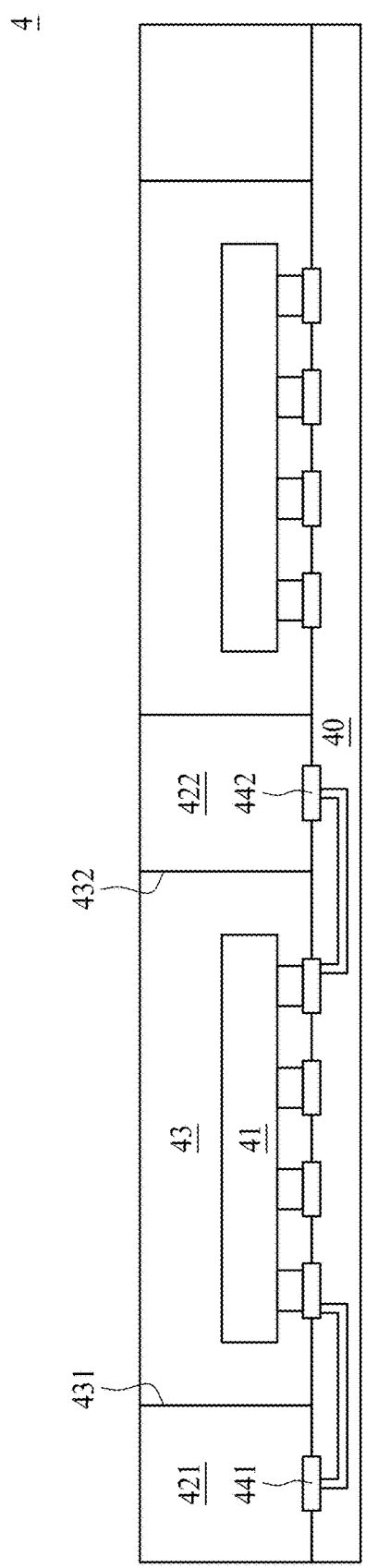
FIG. 4 is a cross-sectional view of a semiconductor device package in accordance with some embodiments of the present disclosure.

FIG. 4 is a cross-sectional view of a semiconductor device package 4 in accordance with some embodiments of the present disclosure. The semiconductor device package 4 includes a flexible substrate 40, an electronic component 41, a first flexible member 421, a second flexible member 422, and a package body 43.

The electronic component 41 is disposed on the flexible substrate 40. The first flexible member 421 and the second flexible member 422 are disposed on the flexible substrate 40. The package body 43 encapsulates the electronic component 41. At least a portion of the package body 43 is disposed between the first flexible member 421 and the second flexible member 422.

In some embodiments, the package body 43 has a first surface 431 contacting the first flexible member 421 and a second surface 432 contacting the second flexible member 422. In some embodiments, the package body 43 has a first surface 431 facing the first flexible member 421 and a second surface 432 facing the second flexible member 422.

In some embodiments, a top surface of the first flexible member 421 is substantially coplanar with a top surface of the package body 43. In some embodiments, a top surface of the first flexible member 421 is higher than a top surface of the package body 43.

In some embodiments, the first flexible member 421 extends away from the flexible substrate 40 (e.g. extends vertically, as shown in FIG. 4) and is disposed over the package body 43 such that a first part (e.g. a top part) of the first flexible member 421 is disposed over the package body 43 (see FIG. 2A). In other words, a top portion of the at least one flexible member 12 may extend laterally and cover at least a portion of the package body 13.

In some embodiments, a lateral surface of a first part of the first flexible member 421 contacts the package body 43.

In some embodiments, the first flexible member 421 includes a first portion and a second portion. The width of the first portion can be different from the width of the second portion. In some embodiments, the first flexible member 421 includes a first portion, a second portion and a third portion. The second portion is disposed between the first portion and the third portion. The width of the second portion is the same as or smaller than at least one of the width of the first portion and the width of the third portion (see FIG. 3A).

In some embodiments, the modulus of elasticity of the first flexible member 421 is different than the modulus of elasticity of the second flexible member 422.

In some embodiments, the shape of the first flexible member 421 is different than the shape of the second flexible member 422.

In some embodiments, the semiconductor device package 4 includes a first conductive contact 441 and a second conductive contact 442. The first conductive contact 441 is disposed on the flexible substrate 40 and is covered by the first flexible member 421. The second conductive contact 442 is disposed on the flexible substrate 40 and is covered by the second flexible member 422. The first conductive contact 441 and the second conductive contact 442 are in electrically connected to the electronic component 41. The first flexible member 421 can be used to protect the first conductive contact 441 and/or components beneath or near the first conductive contact 441. The second flexible member 422 can be used to protect the second conductive contact 442 and/or components beneath or near the second conductive contact 442.

Although not illustrated in FIG. 4, in some embodiments the first conductive contact 441 and second conductive contact 442 are exposed. The first conductive contact 441 and second conductive contact 442 are exposed by removing the flexible members 421 and 422 from the flexible substrate 40. The exposed first conductive contact 441 and second conductive contact 442 may be used for electrical testing.

The semiconductor device package 4 may include a wire-bond type die (not shown in FIG. 4), and the connection wires may be vulnerable to damage by mold flow during a molding operation or an encapsulation operation. Moreover, the electronic components (e.g. electronic component 41) or other devices may be damaged by mold chase during a molding operation or an encapsulation operation. Further, delamination resulted from coefficient of thermal expansion (CTE) mismatch between a molding compound (e.g. the package body 43) and the flexible substrate 40 may cause the electronic components to disconnect from the conductive pads on the flexible substrate 40 (e.g. may break the electrical connection between an electronic component and a conductive pad, or cause the electrical connection to be deficient), potentially creating an open circuit.

Each of the exposed first conductive contact 441 and second conductive contact 442 may be used as a test point/terminal to check whether the circuitry of the semiconductor device package 4 works prior to assembling the semiconductor device package 4 to a system board (e.g. a printed circuit board (PCB)). Problems or defects caused during molding or encapsulation operation as described above can be found by testing the semiconductor device package 4 through the exposed first conductive contact 441 or second conductive contact 442 prior to assembling the semiconductor device package 4 to the system board. In other words, semiconductor device packages with one or more defects may be removed from an assembly line or production process. Therefore, some costs of manufacturing can be saved. Flexible material, which can be the same or similar to a material of the flexible member 421 or 422, may be disposed on the exposed first conductive contact 441 and second conductive contact 442 for protection.

The flexible members 421 and 422 can be removable. After assembling the semiconductor device package 4 to the system board, the flexible member 421 and/or the flexible member 422 can be removed to expose the first conductive contact 441 and/or second conductive contact 442 for electrical testing. After assembling the semiconductor device package 4 to the system board, the flexible member 421 and/or the flexible member 422 are removed to expose the first conductive contact 441 and/or second conductive contact 442 to check whether there is any short or open circuit between the semiconductor device package 4 and the system board.

FIG. 8 sets forth Table 2, which lists an example simulation result for some embodiments of the present disclosure. The external force applied to the semiconductor device package in the simulation is 1 N. The simulation is performed with different shapes of flexible members and different pitches between two flexible members. The results in Table 2 show that the semiconductor device package can achieve a better deflection (e.g., 21.7 mm) when flexible members are of a rectangular shape and the pitch between two flexible members is 5 mm, as compared to some other configurations. The height of a flexible member may be higher than or equal to the height of the package body.

Figure 5:
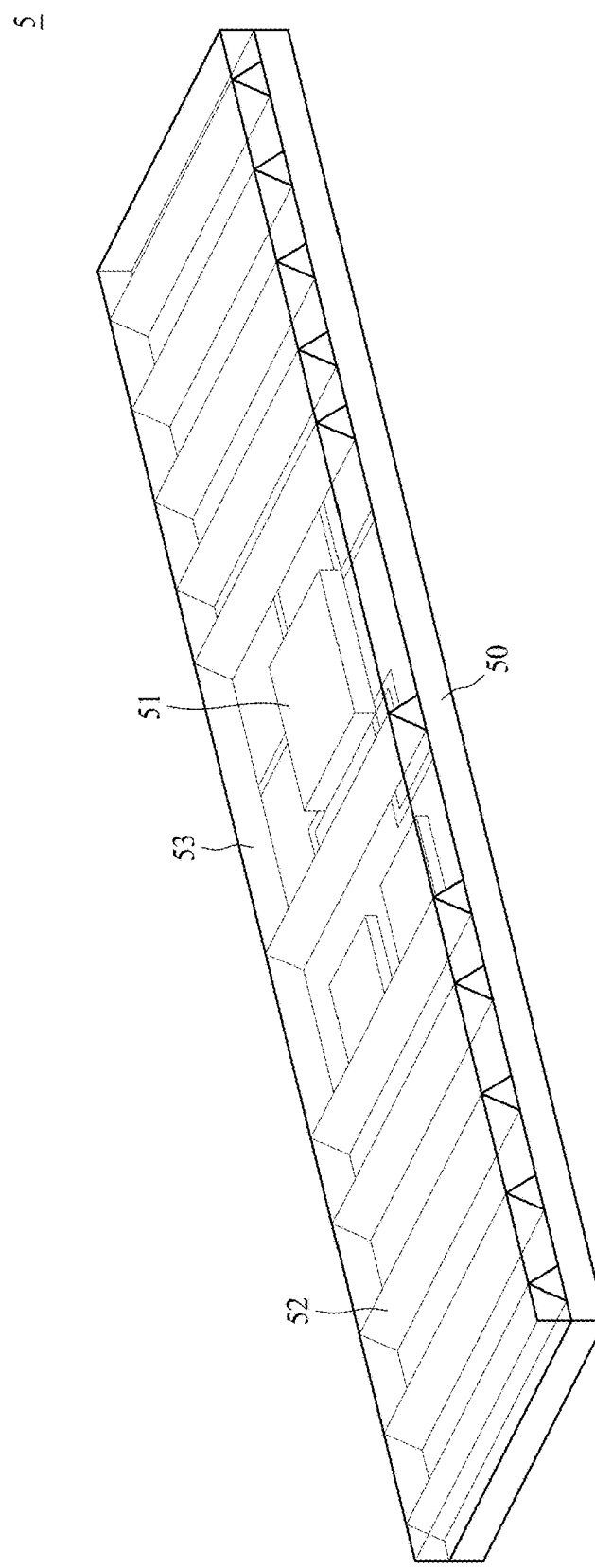
FIG. 5 is a side view of a semiconductor device package in accordance with some embodiments of the present disclosure.

FIG. 5 is a side view of a semiconductor device package 5 in accordance with some embodiments of the present disclosure. The semiconductor device package 5 includes a flexible substrate 50, at least one electronic component 51, at least one flexible member 52, and a package body 53. The package body 53 is shown as transparent in the depicted example to depict internal components of the semiconductor device package 5, but need not be.

Figure 6A:

FIGS. 6A, 6B, 6C, and 6D illustrate a method of manufacturing a semiconductor device package in accordance with some embodiments of the present disclosure. Referring to FIG. 6A, a flexible substrate 10 is provided. The flexible substrate 10 may include a conductive contact 14, or a conductive contact 14 may be disposed on the flexible substrate 10 (not shown).

Referring to FIG. 6B, an electronic component 11 is disposed on the flexible substrate 10. The electronic component 11 may be electrically connected to the flexible substrate 10.

Figure 6C:
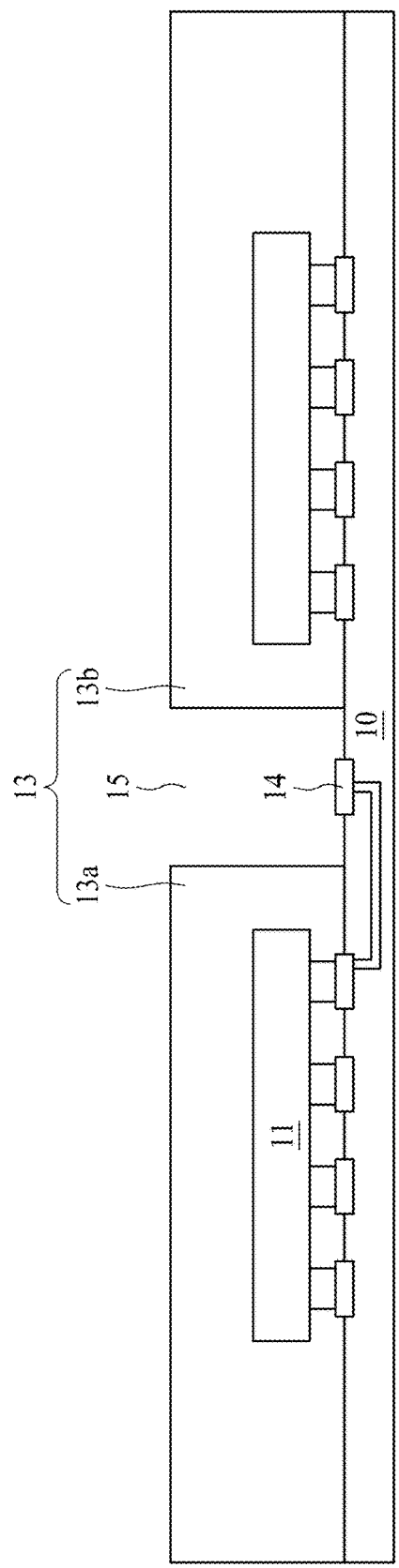

Referring to FIG. 6C, a package body 13 is disposed on the flexible substrate 10 to encapsulate the electronic component 11. A portion of the package body 13 is removed to form a trench 15. The trench 15 is formed by using, for example, laser drill. The trench 15 is defined by the package boy 13 and exposes a conductive contact 14 disposed on the flexible substrate 10. The conductive contact 14 is in electrical connection with the electronic component 11. The exposed conductive contact 14 can be used as a test point to quickly verify whether the electronic component 11 is damaged. The trench 15 separates the package body 13 into a first part 13*a* and a second part 13*b*.

Figure 6D:
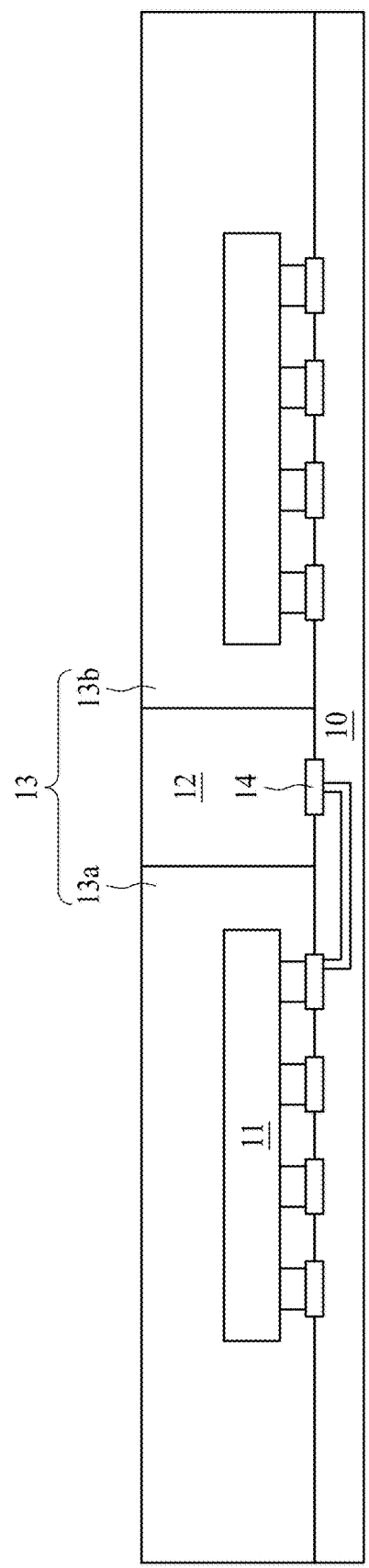

Referring to FIG. 6D, a flexible material is filled into the trench 15 to form a flexible member 12. The flexible material may be of a film type or a liquid type. The flexible member 12 may be formed by curing the flexible material. The flexible member 12 covers the conductive contact 14 and may help to provide protection to the conductive contact 14 and/or other components. The flexible member 12 can be readily removed to expose the conductive contact 14, such that the exposed conductive contact 14 can be used as a test point to quickly verify whether the electronic component 11 is damaged. After the verification, a flexible material can be re-filled into the trench 15 to reform the flexible member 12.

Inserting flexible members in the package body can make the semiconductor device package more flexible. The flexible members along with the flexible substrate can also help to protect the semiconductor device package from excessive bending.

Figure 7A:

FIGS. 7A, 7B, 7C, and 7D illustrate a method of manufacturing a semiconductor device package in accordance with some embodiments of the present disclosure. Referring to FIG. 7A, a flexible substrate 10 is provided.

Referring to FIG. 7B, a flexible member 12 is disposed on the flexible substrate 10. The flexible member 12 may be formed by the following steps: (i) disposing a stencil which has at least one groove on the flexible substrate 10; (ii) filling a flexible material into the at least one groove; (iii) curing the flexible material to form the flexible member 12; and (iv) removing the stencil from the flexible substrate 10.

Figure 7C:
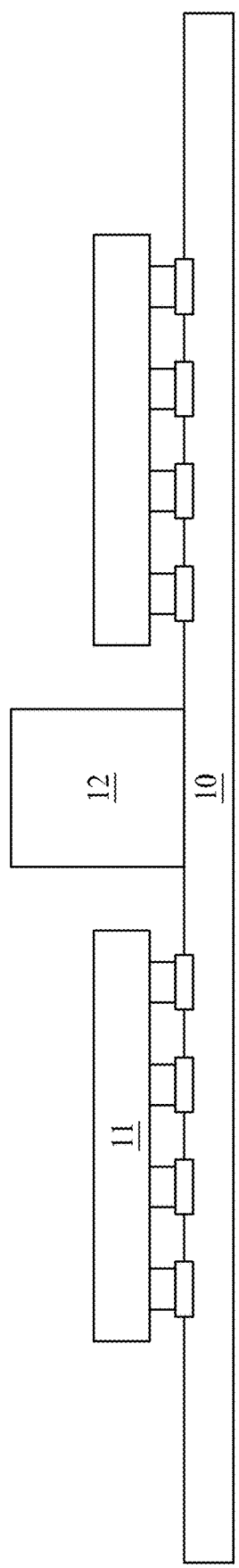

Referring to FIG. 7C, an electronic component 11 is disposed on the flexible substrate 10. The electronic component 11 may be electrically connected to the flexible substrate 10.

Figure 7D:
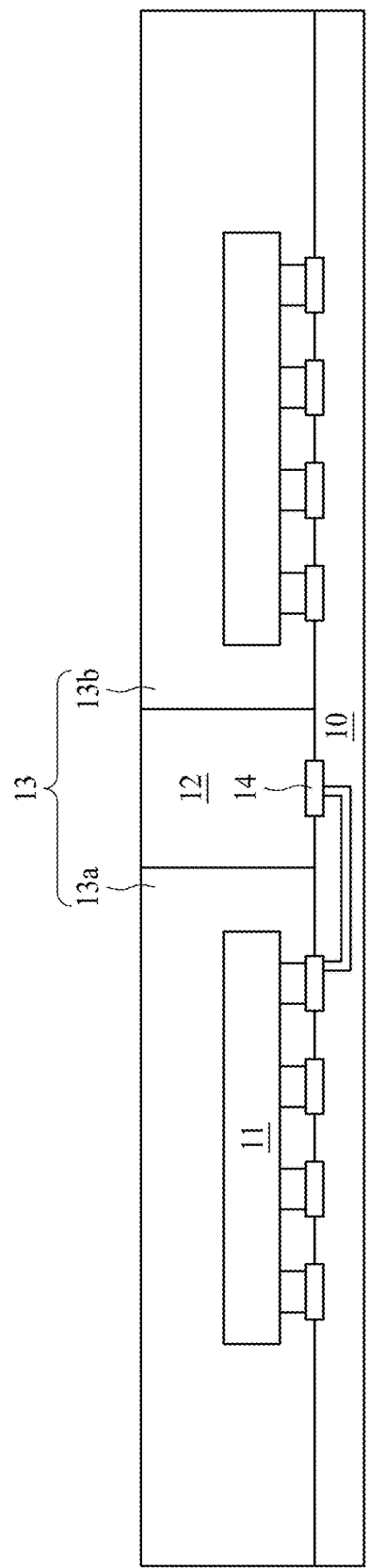

Referring to FIG. 7D, a package body 13 is disposed on the flexible substrate 10 to encapsulate the electronic component 11. The package body 13 has a first part 13*a* and a second part 13*b* that is separated from the first part 13*a* by the flexible member 12. The package body 13 and the flexible member 12 may be thinned by grinding, such that the height of the flexible member 12 is higher than or equal to the height of the package body 12, as desired. The flexible member 12 can be readily removed to expose a conductive contact 14 that is on the flexible substrate 10 and is in electrical connection with the electronic component 11, such that the exposed conductive contact 14 can be used as a test point to quickly verify whether the electronic component 11 is damaged.

As used herein, the singular terms "a," "an," and "the" may include plural referents unless the context clearly dictates otherwise.

In the description of some embodiments, a component provided "on" or "over" another component can encompass cases where the former component is directly on (e.g., in physical contact with) the latter component, as well as cases where one or more intervening components are located between the former component and the latter component.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 µm, within 30 µm, within 20 µm, within 10 µm, or within 1 µm of lying along the same plane.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device package, comprising:
   a flexible substrate;
   an electronic component disposed on the flexible substrate;
   at least one flexible member disposed on the flexible substrate; and
   a package body encapsulating the electronic component and including a first part and a second part separated from the first part by the at least one flexible member,
   wherein the at least one flexible member is non-conductive.

2. The semiconductor device package of claim 1, wherein the first part of the package body has a first surface and the second part of the package body has a second surface, and wherein the at least one flexible member contacts both the first surface and the second surface.

3. The semiconductor device package of claim 1, further comprising a conductive contact disposed on the flexible substrate covered by the at least one flexible member.

4. The semiconductor device package of claim 1, wherein a top surface of the at least one flexible member is higher than a top surface of the package body.

5. The semiconductor device package of claim 1, wherein the at least one flexible member extends away from the flexible substrate and over the package body such that a first part of the at least one flexible member is disposed over the package body.

6. The semiconductor device package of claim 5, wherein a lateral surface of the first part of the at least one flexible member contacts the package body.

7. The semiconductor device package of claim 1, wherein a top surface of the at least one flexible member is substantially coplanar with a top surface of the package body.

8. The semiconductor device package of claim 1, wherein the at least one flexible member includes a first portion and a second portion, and wherein a width of the first portion is different from a width of the second portion.

9. The semiconductor device package of claim 1, wherein the at least one flexible member includes a first portion, a second portion and a third portion, the second portion is disposed between the first portion and the third portion, and a width of the second portion is the same as or smaller than at least one of a width of the first portion or a width of the third portion.

10. The semiconductor device package of claim 1, wherein the modulus of elasticity of the at least one flexible member is between 0.4 MPa and 70 MPa.

11. The semiconductor device package of claim 1, wherein the at least one flexible member includes an elastomeric material.

12. The semiconductor device package of claim 1, wherein the at least one flexible member includes silicone.

13. A semiconductor device package, comprising:
    a flexible substrate;
    an electronic component disposed on the flexible substrate;
    a first flexible member and a second flexible member disposed on the flexible substrate; and
    a package body encapsulating the electronic component, at least a portion of the package body disposed between the first flexible member and the second flexible member,
    wherein the first flexible member and the second flexible member are non-conductive.

14. The semiconductor device package of claim 13, wherein the package body has a first surface contacting the first flexible member and a second surface contacting the second flexible member.

15. The semiconductor device package of claim 13, wherein a top surface of the first flexible member is higher than a top surface of the package body.

16. The semiconductor device package of claim 13, wherein the first flexible member extends away from the flexible substrate and over the package body such that a first part of the first flexible member is disposed over the package body.

17. The semiconductor device package of claim 16, wherein a lateral surface of the first part of the first flexible member contacts the package body.

18. The semiconductor device package of claim 13, wherein the first flexible member includes a first portion and a second portion, and wherein a width of the first portion is different from a width of the second portion.

19. The semiconductor device package of claim 13, wherein the first flexible member includes a first portion, a second portion and a third portion, the second portion is disposed between the first portion and the third portion, and a width of the second portion is the same as or smaller than at least one of a width of the first portion or a width of the third portion.

20. The semiconductor device package of claim 13, wherein the modulus of elasticity of the first flexible member is different than the modulus of elasticity of the second flexible member.

21. The semiconductor device package of claim 13, wherein a shape of the first flexible member is different than a shape of the second flexible member.

22. The semiconductor device package of claim 13, further comprising a first conductive contact disposed on the flexible substrate covered by the first flexible member and a second conductive contact disposed on the flexible substrate covered by the second flexible member.

23. A semiconductor device package, comprising:
 a flexible substrate;
 an electronic component disposed on the flexible substrate;
 at least one flexible member disposed on the flexible substrate; and
 a package body encapsulating the electronic component and including a first part and a second part separated from the first part by the at least one flexible member;
 wherein the at least one flexible member is disposed over at least a portion of the package body.

24. The semiconductor device package of claim 23, wherein the package body has an inclined surface covered by the at least one flexible member.

* * * * *